United States Patent
Yamamoto et al.

(10) Patent No.: US 7,902,860 B2
(45) Date of Patent: Mar. 8, 2011

(54) SEMICONDUCTOR CIRCUIT, AND COMPUTING DEVICE AND COMMUNICATIONS DEVICE USING THE SAME

(75) Inventors: Keiichi Yamamoto, Yamato (JP); Norio Chujo, Tokyo (JP); Toru Yazaki, Yokohama (JP); Hisaaki Kanai, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/145,829

(22) Filed: Jun. 25, 2008

(65) Prior Publication Data
US 2009/0085688 A1 Apr. 2, 2009

(30) Foreign Application Priority Data
Sep. 28, 2007 (JP) .................................. 2007-254520

(51) Int. Cl.
*H03K 17/16* (2006.01)
*H03K 19/003* (2006.01)

(52) U.S. Cl. .............................. 326/32; 326/30; 333/17.3
(58) Field of Classification Search .............. 326/30–32; 333/17.3
See application file for complete search history.

(56) References Cited

U.S. PATENT DOCUMENTS

| | | | | |
|---|---|---|---|---|
| 6,064,224 A * | 5/2000 | Esch et al. | ...................... | 326/30 |
| 6,414,525 B2 * | 7/2002 | Urakawa | ....................... | 327/112 |
| 6,535,047 B2 * | 3/2003 | Mughal et al. | ................ | 327/378 |
| 6,573,746 B2 * | 6/2003 | Kim et al. | ........................ | 326/30 |
| 6,674,302 B2 * | 1/2004 | Yen | ................... | 326/30 |
| 7,285,977 B2 * | 10/2007 | Kim | ................................ | 326/30 |
| 7,304,495 B2 * | 12/2007 | Nygren | ........................... | 326/30 |
| 2004/0008054 A1 * | 1/2004 | Lesea et al. | ...................... | 326/30 |
| 2006/0158216 A1 * | 7/2006 | Aoyama et al. | ................. | 326/30 |
| 2007/0236247 A1 * | 10/2007 | Wang et al. | ..................... | 326/30 |
| 2008/0048714 A1 * | 2/2008 | Lee et al. | ........................ | 326/30 |
| 2008/0112246 A1 * | 5/2008 | Mei | ........................... | 365/210.1 |

* cited by examiner

*Primary Examiner* — James H. Cho
*Assistant Examiner* — Jason M Crawford
(74) *Attorney, Agent, or Firm* — Antonelli, Terry, Stout & Kraus, LLP.

(57) ABSTRACT

In a semiconductor circuit, an impedance adjustment circuit having the characteristics same as those of a circuit having the nonlinear resistance characteristics is configured to include an operating point calculation circuit automatically calculating an operating point with a reference resistance through feedback control, and an impedance calculation circuit calculating the impedance at the operating point found by the operating point calculation circuit. The impedance adjustment circuit is also provided with an impedance determination circuit that determines whether or not the impedance found by the impedance calculation circuit is in a predetermined range. These components, i.e., the operating point calculation circuit, the impedance calculation circuit, and the impedance determination circuit, are provided each two for High-side and Low-side impedance adjustment use.

13 Claims, 13 Drawing Sheets

1

SEMICONDUCTOR CIRCUIT, AND COMPUTING DEVICE AND COMMUNICATIONS DEVICE USING THE SAME

CLAIM OF PRIORITY

The present application claims priority from Japanese application serial no. JP2007-254520, filed on Sep. 28, 2007, the content of which is hereby incorporated by reference into this application.

BACKGROUND OF THE INVENTION

1. Field of the Invention

The present invention relates to an impedance adjustment technology for use with semiconductor circuits and, more specifically, to a technology that is effective when applied to an input/output circuit having the nonlinear resistance characteristics, and a computing device, a communications device, and others using the input/output circuit.

2. Description of Related Art

The results of the study conducted by the inventor of the invention tell that, in the impedance adjustment technology for use with semiconductor circuits, driver circuits for high-speed transmission are CMOS (Complementary Metal Oxide Semiconductor) output circuits that are effective for size reduction and power savings, for example. Such a CMOS output circuit is using a MOS (Metal Oxide Semiconductor) for a resistance element, i.e., transmission gate, and thus the output resistance value is nonlinear with respect to the output voltage. For adjusting such a resulting output resistance value, generally, the voltage-current characteristics are measured for the circuit, and the output resistance value at an operating point is found on the graph by manual differentiation of the resulting measurement value.

SUMMARY OF THE INVENTION

The issue here is that, with such a driver circuit, the operation such as impedance adjustment therefor is often performed manually, e.g., differentiation is made manually for the measurement value of the voltage-current characteristics of the circuit. There is thus a demand for performing such an operation automatically.

In consideration thereof, the invention provides a technology for enabling automatic adjustment of impedance that is essential requirements for product application when an environmental change occurs, e.g., temperature change.

Other new features of the invention will become more apparent from the following detailed description of the present invention when taken in conjunction with the accompanying drawings.

In the invention disclosed in this specification, a typical aspect is briefly described as below.

That is, the typical aspect of the invention is directed to an impedance adjustment circuit that has the characteristics same as those of a circuit having the nonlinear resistance characteristics. The impedance adjustment circuit is provided with an operating point calculation circuit that automatically calculates an operating point with a reference resistance (generally 50Ω) through feedback control, and an impedance calculation circuit that calculates the impedance at the operating point found by the operating point calculation circuit. The impedance adjustment circuit is also provided with an impedance determination circuit that determines whether or not the impedance found by the impedance calculation circuit is in a predetermined range. These components, i.e., the operating point calculation circuit, the impedance calculation circuit, and the impedance determination circuit, are provided two each for High-side impedance adjustment use and Low-side impedance adjustment use.

These and other objects, features and advantages of the invention will be apparent from the following more particular description of preferred embodiments of the invention, as illustrated in the accompanying drawings.

DESCRIPTION OF THE PREFERRED EMBODIMENT

Figure 1:
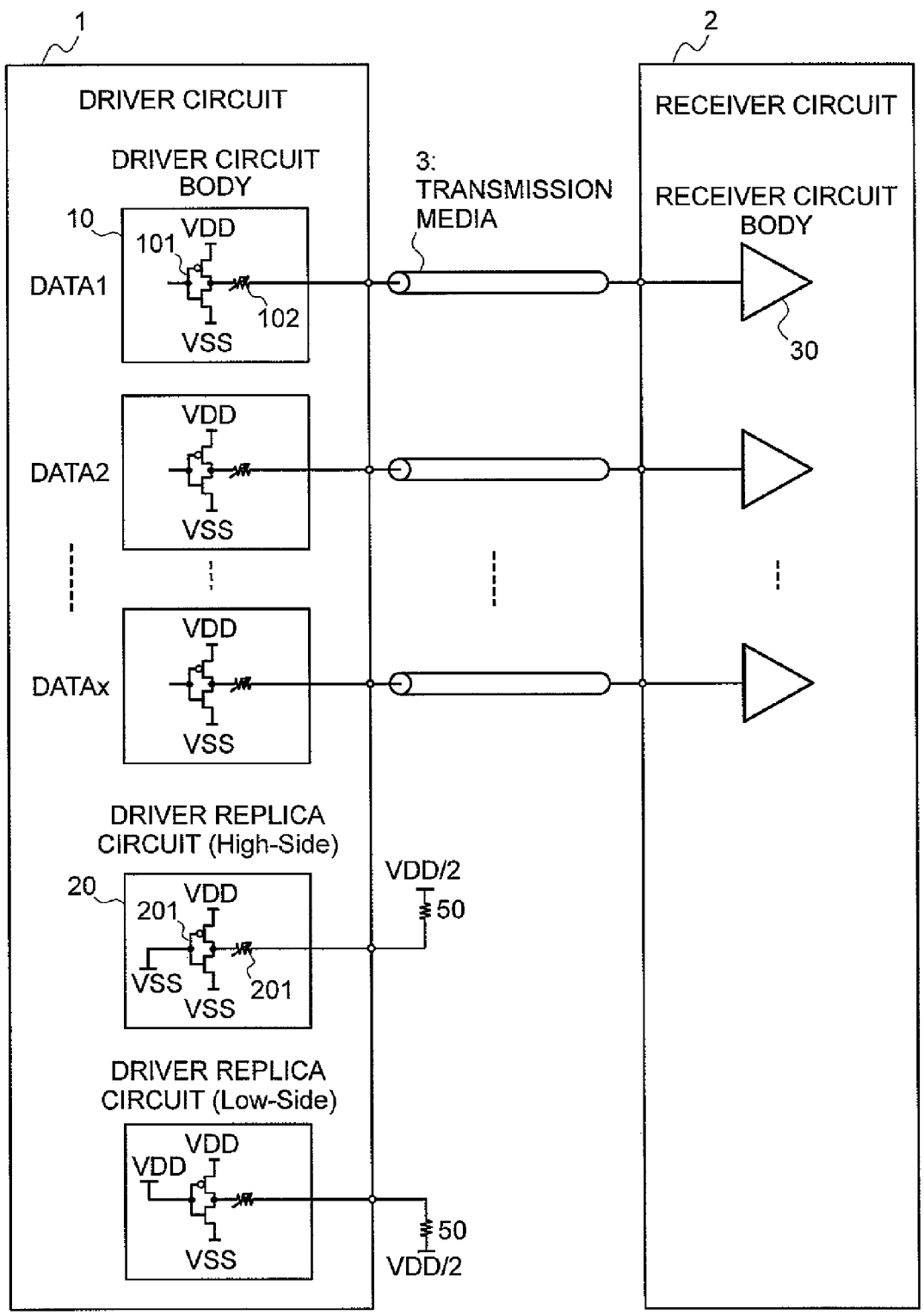
FIG. 1 is a configuration diagram of a driver circuit and that of a receiver circuit in a semiconductor circuit of the conventional technology against the invention.

In the below, an embodiment of the invention is described in detail by referring to the accompanying drawings. Note here that, in all drawings for use to describe the embodiment, any similar components are provided with the same reference numeral in principle, and are not described twice.

Also in the below, for the purpose of making it easier to understand the characteristics of the invention, the conventional technology against the invention is described first, and then in comparison therewith, the embodiment of the invention is described.

Conventional Technology against the Invention FIG. 1 is a configuration diagram of a driver circuit and that of a receiver circuit in a semiconductor circuit.

As shown in FIG. 1, a driver circuit 1 for use of high-speed transmission, for example, is connected to a receiver circuit 2 via transmission media 3. This driver circuit 1 uses a CMOS output circuit that works effective for size reduction and power savings thereof. This driver circuit 1 is provided with, in addition to driver circuit bodies 10 for data signals, i.e., DATA1 to DATAx, driver replica circuits 20 for impedance adjustment use.

The driver circuit bodies 10 for data signals are each configured to include a CMOS circuit 101 and a variable resistance 102. The CMOS circuit 101 is configured by a PMOS (P-channel Metal Oxide Semiconductor) and an NMOS (N-channel Metal Oxide Semiconductor), and the variable resistance 102 is provided for impedance adjustment use. Such driver circuit bodies 10 are respectively connected to receiver circuit bodies 30 in the receiver circuit 2 via the transmission media 3 such as cables and circuit wiring. The driver circuit bodies 10 each output transmission signals, and these transmission signals are received by the receiver circuit bodies 30.

The driver replica circuits 20 include a driver replica circuit for High-side impedance adjustment use, and a driver replica circuit for Low-side impedance adjustment use. The driver replica circuits 20 are each provided with the characteristics same as those of the driver circuit bodies 10, and are configured to include a CMOS circuit 201 and a variable resistance 202. The CMOS circuit 201 is also configured by a PMOS and an NMOS, and the variable resistance 202 is also provided for impedance adjustment use. The output of the driver replica circuit for High-side impedance adjustment use is connected with a reference resistance connected to a VDD/2 potential. The output of the driver replica circuit for Low-side impedance adjustment use is connected with another reference resistance also connected to a VDD/2 potential.

The driver circuit 1 is generally provided with the driver replica circuits 20 having the characteristics same as those of the driver circuit bodies 10. This is because if the driver circuit bodies 10 are each provided with an impedance adjustment circuit, the resulting extra circuit will degrade the transmission characteristics thereof. As such, using the driver replica circuits 20, impedance adjustment is performed, and the adjustment result is reflected to the driver circuit bodies 10 so that the impedance of the driver circuit 1 is optimally adjusted.

Figure 2:
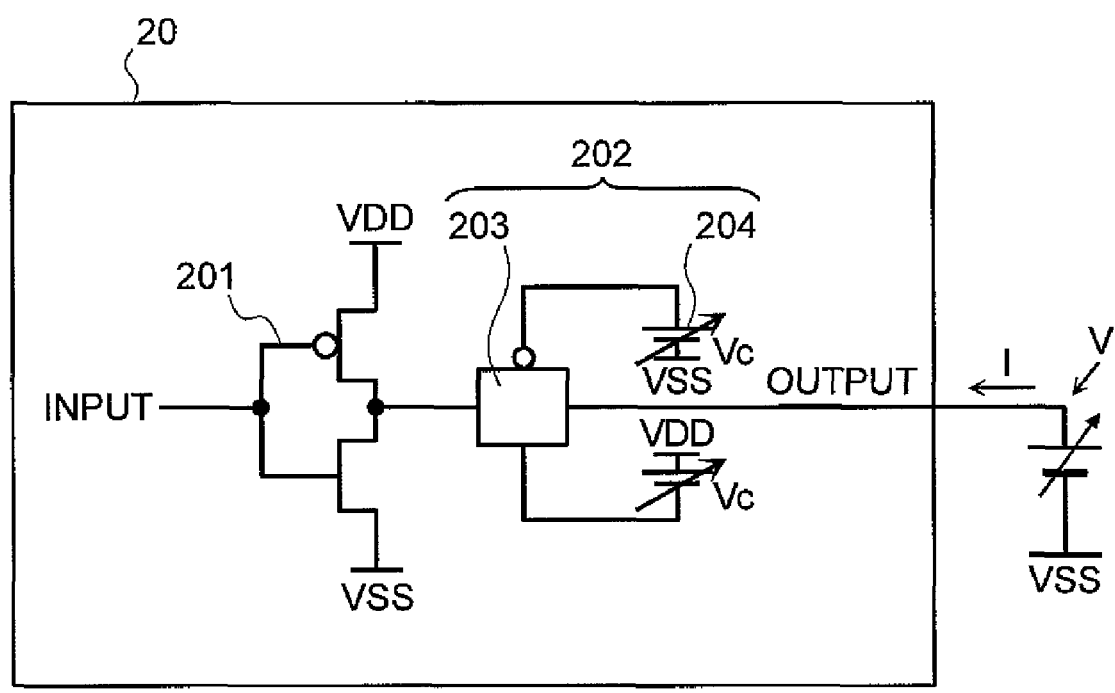
FIG. 2 is a circuit diagram of a driver replica circuit in the semiconductor circuit of the conventional technology against the invention.
Figure 3:
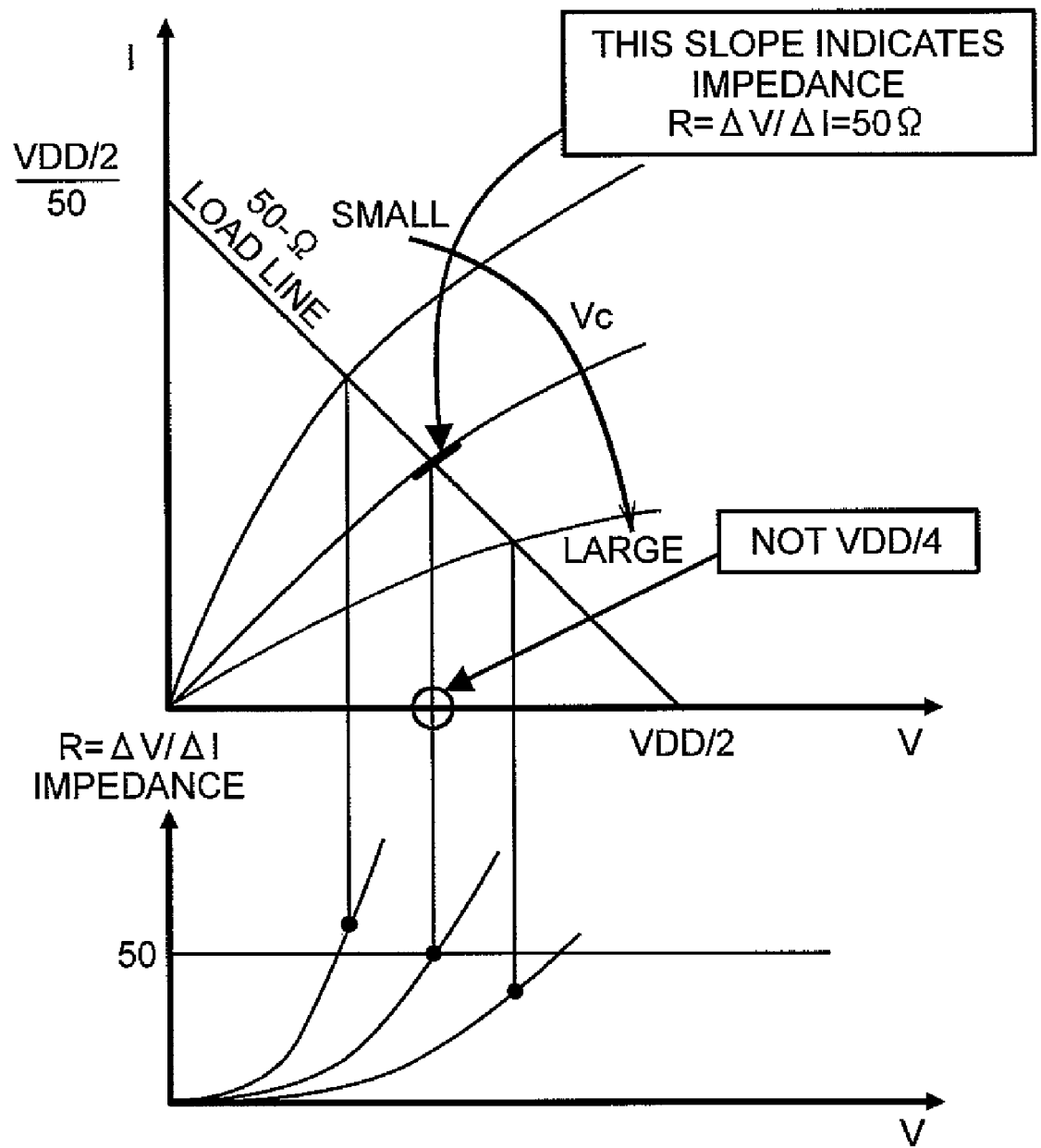
FIG. 3 is a characteristics diagram showing an impedance adjustment method for the driver replica circuit in the semiconductor circuit of the conventional technology against the invention.

FIG. 2 is a circuit diagram of the driver replica circuit. FIG. 3 is a characteristics diagram showing an impedance adjustment method of the driver replica circuit.

As described above, the driver replica circuit 20 is provided with the CMOS circuit 201 configured by a PMOS and an NMOS, and the variable resistance 202 for impedance adjustment use. This variable resistance 202 is provided for the purpose of optimizing the transmission efficiency by finding the matching with the characteristics impedance (generally 50Ω) of the transmission media 3. In the real world, as shown in FIG. 2, the driver replica circuit 20 is so configured as to perform resistance value adjustment by adjusting, in a variable voltage source 204, the gate voltage of a transmission gate 203 in such a manner as to be the voltage Vc, thereby enabling indication of a variable resistance in an equivalent manner.

In this driver replica circuit 20, because the transmission gate 203 of the variable resistance 202 is the MOS, as shown in FIG. 3, the output resistance value is nonlinear with respect to the output voltage. Therefore, for adjusting such a resulting output resistance value, the voltage-current characteristics are measured for the circuit, and the output resistance value at an operating point is found on the graph by manual differentiation of the resulting measurement value.

Specifically when the resistance value is matched to 50Ω, first of all, a V (voltage)–I (current) curve is measured by changing the voltage Vc of the variable voltage source 204. Using the resulting V–I curve, the impedance (R=ΔV/ΔI) is then calculated. Thereafter, on the V–I curve, a 50Ω-load curve (V=VDD/2, I=(VDD/2)/50) is rendered. At the intersection point of the V–I curve and the 50Ω-load curve, a search is made for a value of the voltage Vc at which the slope of the V–I curve is close to 50Ω.

As such, in the conventional technology against the invention, the operation such as impedance adjustment for a CMOS driver circuit is often performed manually, e.g., differentiation is made manually for the measurement value of the V–I curve of the circuit. In consideration thereof, in the invention, such an operation is performed automatically, and the embodiment of the invention is described in detail below.

Embodiment of the Invention

A semiconductor circuit in the embodiment of the invention is configured to include a normal circuit body (first circuit) having the nonlinear input resistance characteristics, the nonlinear output resistance characteristics, or the nonlinear input/output resistance characteristics, and an impedance adjustment circuit (second circuit) including a replica circuit having the characteristics same as those of the circuit body, i.e., the nonlinear input resistance characteristics, the nonlinear output resistance characteristics, or the nonlinear input/output resistance characteristics. In the below, described mainly is a driver circuit having the nonlinear output resistance characteristics, but this is surely not the only option, and the invention is applicable also to a receiver circuit having the nonlinear input resistance characteristics, or an input/output circuit having the nonlinear input/output resistance characteristics.

Configuration of Impedance Adjustment Circuit

Figure 4:
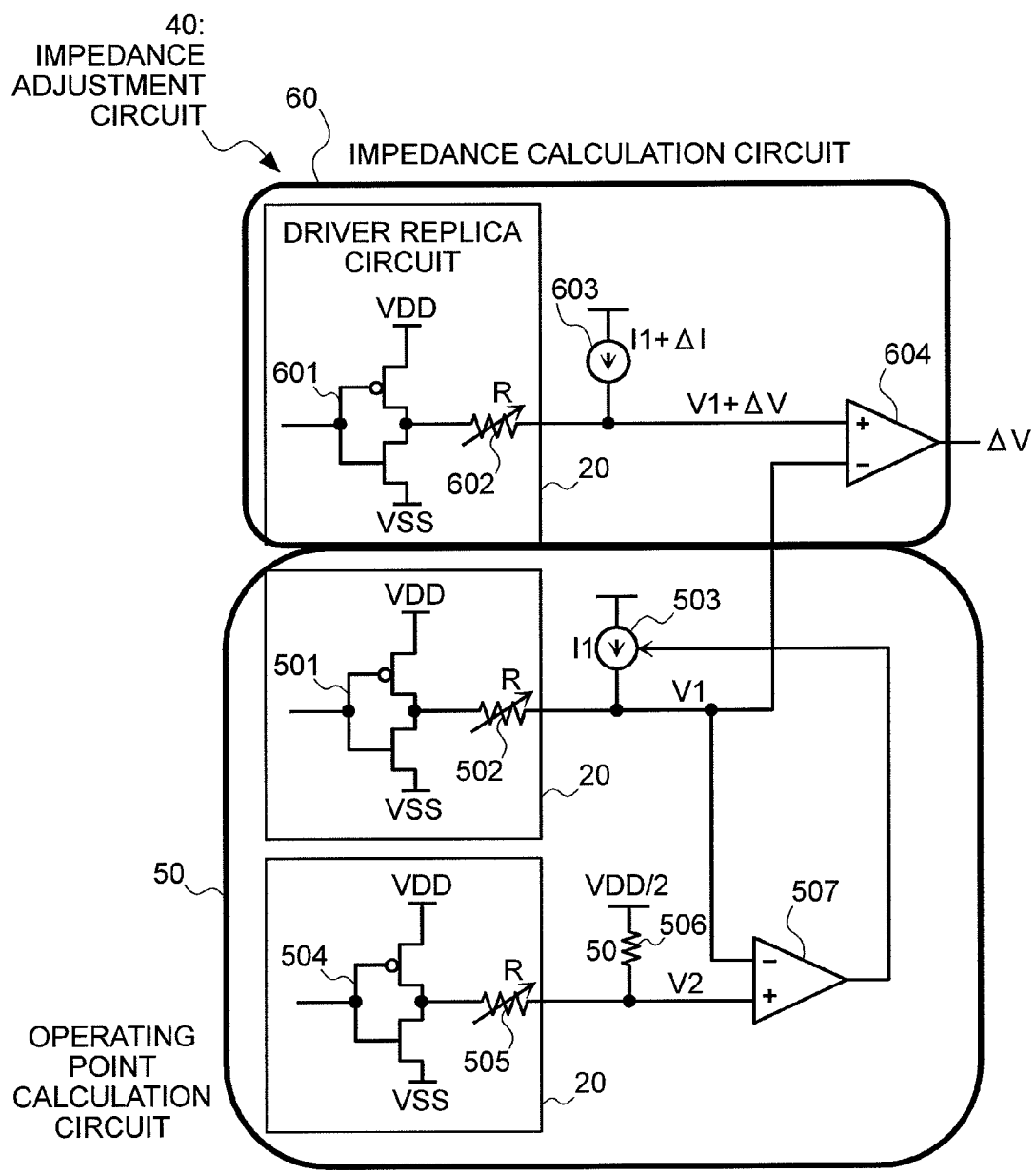
FIG. 4 is a circuit diagram of an impedance adjustment circuit of a driver circuit in a semiconductor circuit of an embodiment of the invention.
Figure 5:
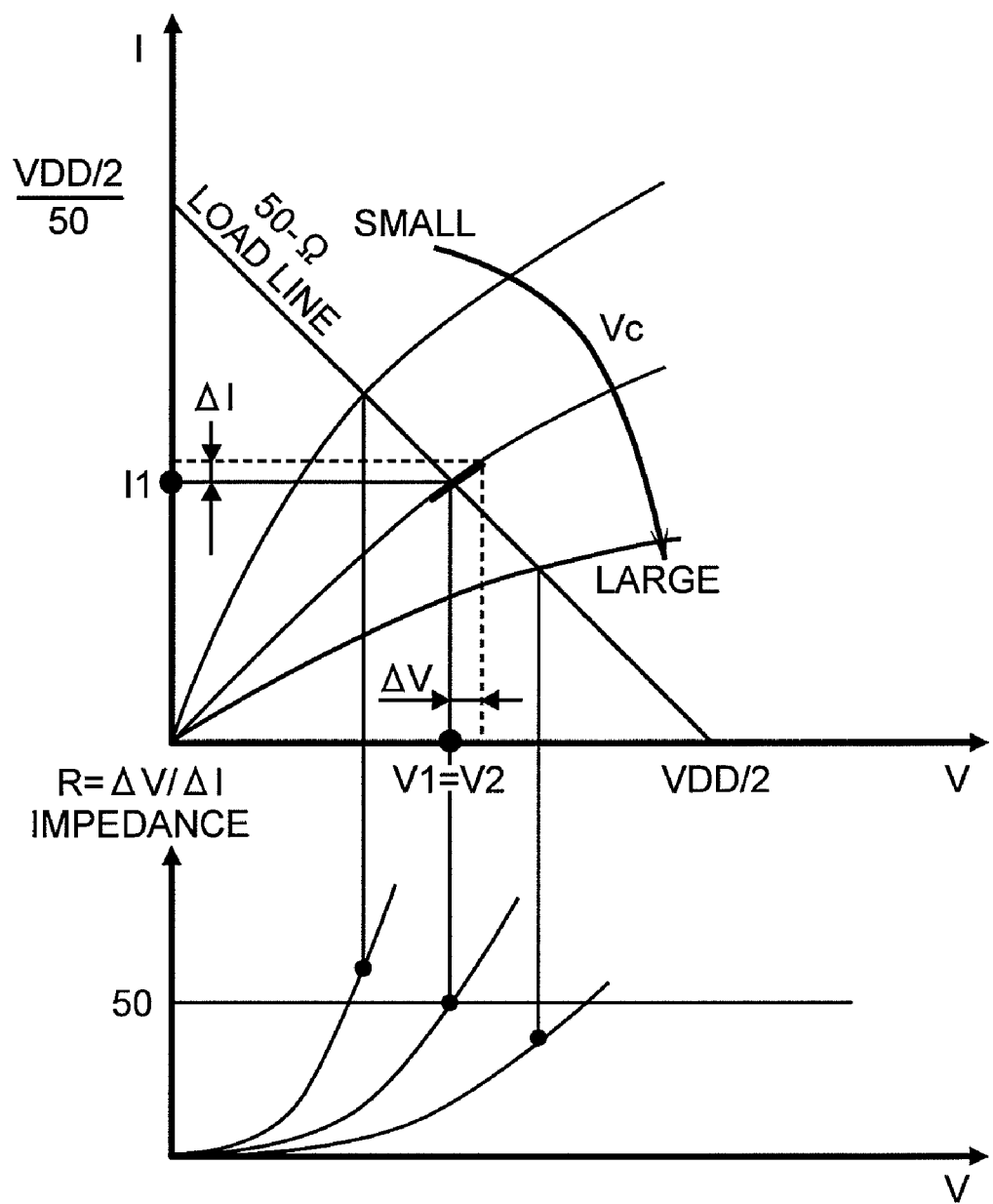
FIG. 5 is a characteristics diagram showing an impedance adjustment method for an impedance adjustment circuit in the semiconductor circuit of the embodiment of the invention.

FIG. 4 is a circuit diagram of an impedance adjustment circuit in a driver circuit of the semiconductor circuit. FIG. 5 is a characteristics diagram showing an impedance adjustment method of the impedance adjustment circuit.

An impedance adjustment circuit 40 of FIG. 4 includes three of the driver replica circuit 20 described above, and is configured by an operating point calculation circuit 50 and an impedance calculation circuit 60. The operating point calculation circuit 50 serves to automatically calculate an operating point with a reference resistance through feedback control, and the impedance calculation circuit 60 serves to calculate the impedance at the operating point found by the operating point calculation circuit 50.

The operating point calculation circuit 50 is configured to include a first CMOS circuit 501, a first variable resistance 502, a first current source 503, a second CMOS circuit 504, a second variable resistance 505, a reference resistance 506, and a first differential amplifier 507. As to the first variable resistance 502, a first end thereof is connected to an output of the CMOS circuit 501. The first current source 503 is connected between a second end of the variable resistance 502 and the power supply potential. As to the second variable resistance 505, a first end thereof is connected to an output of the second CMOS circuit 504. The reference resistance 506 is connected between a second end of the second variable resistance 505 and the power supply/2 potential. As to the first differential amplifier 507, each input is connected to both the second ends of the first and second variable resistances 502 and 505, and an output thereof is used for control of the first current source 503. The components, i.e., the first CMOS circuit 501, the first variable resistance 502, the second CMOS circuit 504, and the second variable resistance 505, configure the driver replica circuit 20.

The impedance calculation circuit 60 is configured to include a third CMOS circuit 601, a third variable resistance 602, a second current source 603, and a second differential amplifier 604. As to the third variable resistance 602, a first end thereof is connected to an output of the CMOS circuit 601. The second current source 603 is connected between a second end of the third variable resistance 602 and the power supply potential. As to the second differential amplifier 604, an each input is connected to both the second ends of the third and first variable resistances 602 and 502. These components, i.e., the third CMOS circuit 601 and the third variable resistance 602, configure the driver replica circuit 20.

In the impedance adjustment circuit 40 configured as such, for adjusting the impedance, as shown in FIG. 5, first of all, in the operating point calculation circuit 50, the current I1 of the first current source 503 is so controlled that the input voltage V1 on the side of the first variable resistance 502 is equalized with the input voltage V2 on the side of the second variable resistance 505. The input voltages V1 and V2 are those to be directed to the first differential amplifier 507. Through such control over the current I1 of the first current source 503, an intersection point of the V–I curve and the 50Ω-load curve is found in the circuit. Next, in the impedance calculation circuit 60, the second current source 603 is changed by the current of ΔI at thus found intersection point, thereby outputting the resulting voltage ΔV from the second differential amplifier 604. Based on the current ΔI and the voltage ΔV, the impedance R=ΔV/ΔI is then calculated.

Another Configuration of Impedance Adjustment Circuit (with a Fewer Number of Driver Replica Circuits)

Figure 6:
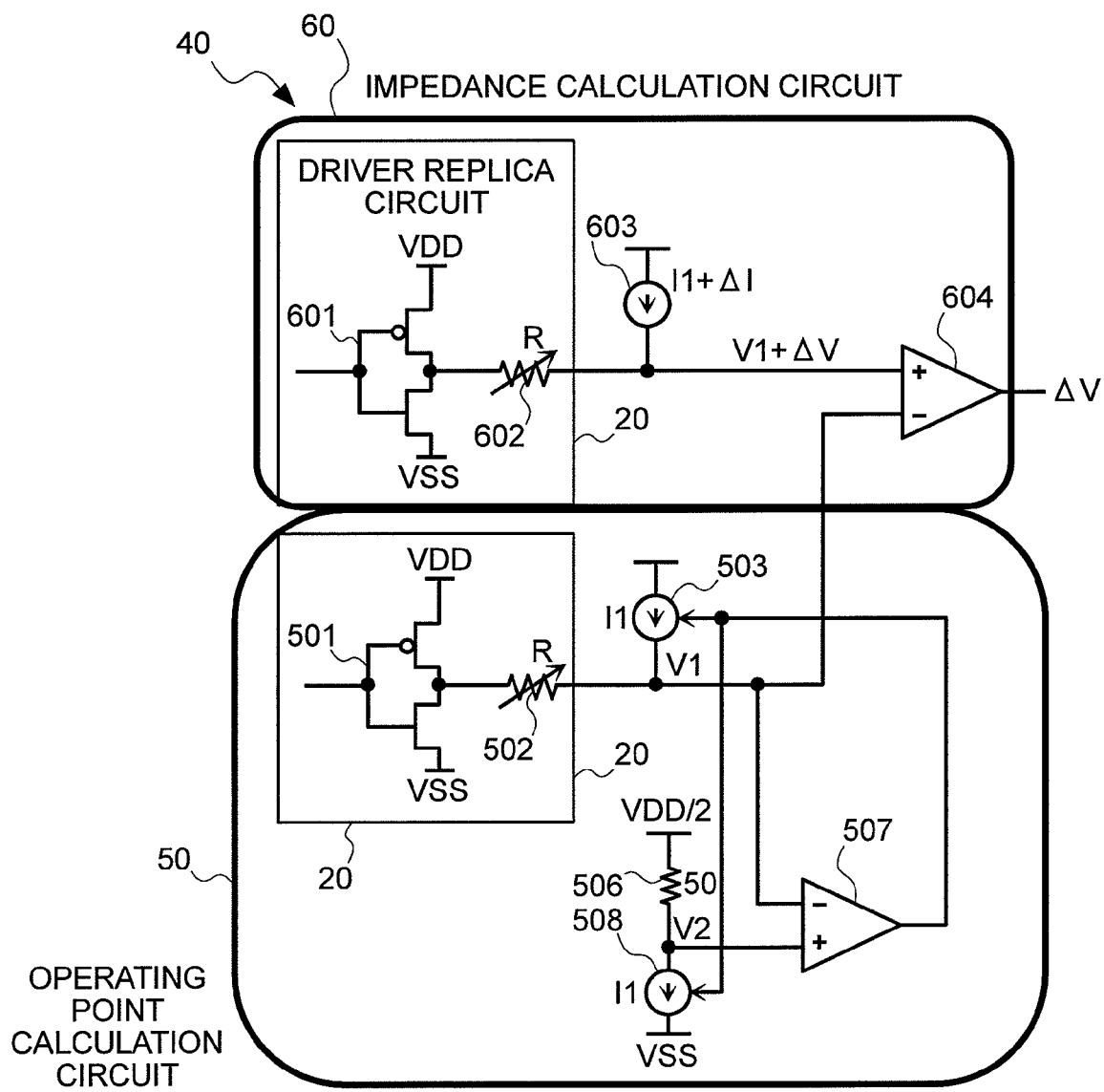
FIG. 6 is a circuit diagram of the impedance adjustment circuit in the semiconductor circuit of the embodiment of the invention, showing another configuration thereof, i.e., with a fewer number of driver replica circuits.

FIG. 6 is a circuit diagram of the impedance adjustment circuit of another configuration.

The impedance adjustment circuit of FIG. 6 is of an exemplary configuration with a fewer number of driver replica circuits compared with the configuration of FIG. 4. Described mainly here is an operating point calculation circuit that is different from that of FIG. 4.

In the impedance adjustment circuit 40 of FIG. 6, the operating point calculation circuit 50 is configured to include the first CMOS circuit 501, the first variable resistance 502, the first current source 503, the reference resistance 506, a third current source 508, and the first differential amplifier 507. As to the first variable resistance 502, the first end thereof is connected to the output of the first CMOS circuit 501. The first current source 503 is connected between the second end of the first variable resistance 502 and the power supply potential. As to the reference resistance 506, the first end thereof is connected to the power supply/2 potential. The third current source 508 is connected between the second end of the reference resistance 506 and the ground potential. As to the first differential amplifier 507, each of the input is connected to both the second end of the first variable resistance 502 and the second end of the reference resistance 506, and the output thereof is used for control of the first and third current sources 503 and 508.

In the impedance adjustment circuit 40 configured as such, for adjusting the impedance, first of all, in the operating point calculation circuit 50, the current I1 of the first current source 503 is so controlled that the input voltage V1 on the side of the first variable resistance 502 is equalized with the input voltage V2 on the side of the reference resistance 506. The input voltages V1 and V2 are those to be directed to the first differential amplifier 507. Through such control over the current I1 of the first current source 503, an intersection point of the V–I curve and the load curve of the reference resistance is found. Next, in the impedance calculation circuit 60, the second current source 603 is changed by the current of ΔI at thus found intersection point, thereby outputting the resulting voltage ΔV from the second differential amplifier 604. Based on the current ΔI and the voltage ΔV, the impedance R=ΔV/ΔI is then calculated.

The impedance adjustment circuit 40 of FIG. 6 has advantages of including one fewer driver replica circuits 20 compared with that of FIG. 4.

Still Another Configuration of Impedance Adjustment Circuit (Impedance Calculation is Performed with Higher Accuracy)

Figure 7:
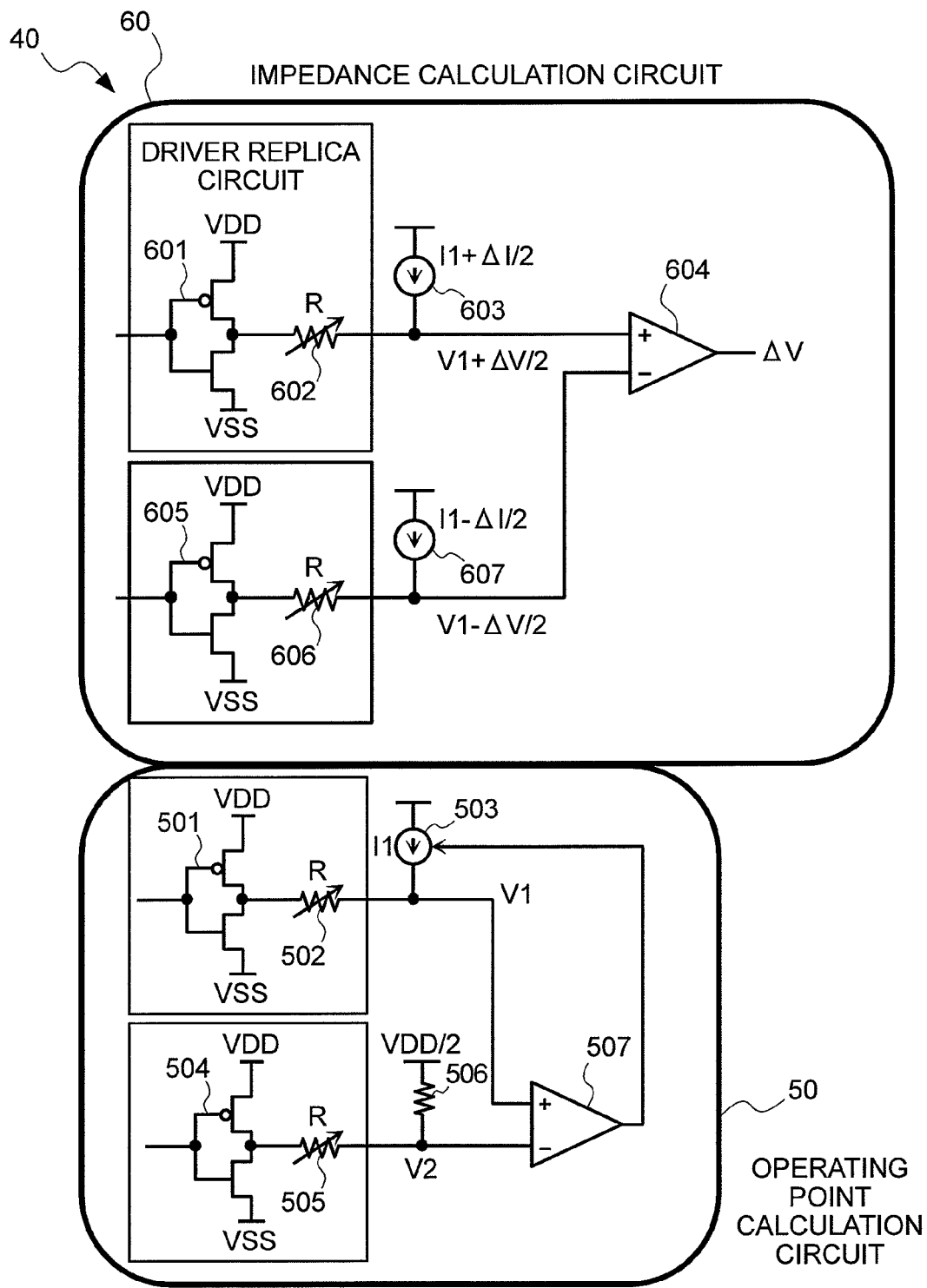
FIG. 7 is a circuit diagram of the impedance adjustment circuit in the semiconductor circuit of the embodiment of the invention, showing still another configuration thereof, i.e., impedance calculation is performed with higher accuracy.

FIG. 7 is a circuit diagram of the impedance adjustment circuit of still another configuration.

The impedance adjustment circuit of FIG. 7 is of an exemplary configuration with a higher accuracy for impedance calculation compared with the configuration of FIG. 4. Described mainly here is an impedance calculation circuit that is different from that of FIG. 4.

In the impedance adjustment circuit 40 of FIG. 7, the impedance calculation circuit 60 is configured to include the third CMOS circuit 601, the third variable resistance 602, the second current source 603, a fourth CMOS circuit 605, a fourth variable resistance 606, a third current source 607, and the second differential amplifier 604. As to the third variable resistance 602, the first end thereof is connected to the output of the third CMOS circuit 601. The second current source 603 is connected between the second end of the third variable resistance 602 and the power supply potential. As to the fourth variable resistance 606, a first end thereof is connected to an output of the fourth CMOS circuit 605. The third current source 607 is connected between a second end of the fourth variable resistance 606 and the power supply potential. As to the second differential amplifier 604, each of the input is connected to both the second ends of the third and fourth variable resistances 602 and 606.

In the impedance adjustment circuit 40 configured as such, for adjusting the impedance, first of all, in the operating point calculation circuit 50, the current I1 of the first current source 503 is so controlled that the input voltage V1 on the side of the first variable resistance 502 is equalized with the input voltage V2 on the side of the reference resistance 506. The input voltages V1 and V2 are those to be directed to the first differential amplifier 507. Through such control over the current I1 of the first current source 503, an intersection point of the V–I curve and the load curve of the reference resistance is found. Next, in the impedance calculation circuit 60, the second and third current sources 603 and 607 are each changed by the current of ΔI/2 at thus found intersection point, thereby outputting the resulting voltage ΔV from the second differential amplifier 604. Based on the current ΔI and the voltage ΔV, the impedance R=ΔV/ΔI is then calculated.

Compared with the impedance adjustment circuit 40 of FIG. 4 and that of FIG. 6 calculating the impedance using V1 and V1+ΔV, the impedance adjustment circuit 40 of FIG. 7 calculates the impedance using V1±ΔV/2, thereby leading to advantages of being able to calculate the impedance with a higher accuracy. Note here that the point of impedance calculation in FIGS. 4 and 6 has the slope of V1±ΔV/2, but that in FIG. 7 has the slope of V1.

Still Another Configuration of Impedance Adjustment Circuit (Impedance Determination Circuit is Additionally Provided)

Figure 8:
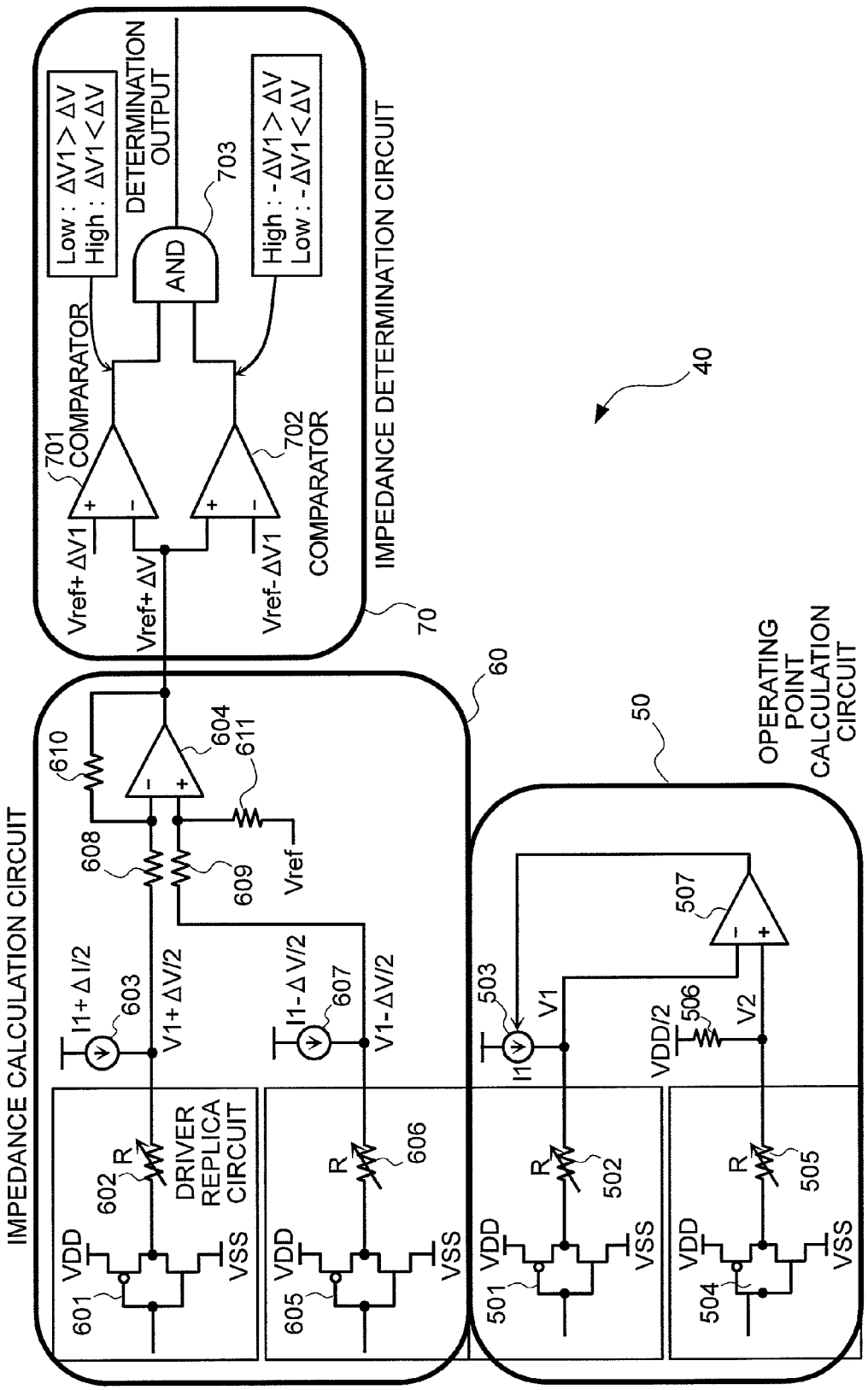
FIG. 8 is a circuit diagram of the impedance adjustment circuit in the semiconductor circuit of the embodiment of the invention, showing still another configuration thereof, i.e., impedance determination circuit is additionally provided.

FIG. 8 is a circuit diagram of an impedance adjustment circuit of still another configuration.

The impedance adjustment circuit of FIG. 8 is of an exemplary configuration with an additional impedance determination circuit compared with the configuration of FIG. 7. FIG. 8 is described by taking the impedance determination circuit additionally provided to the configuration of FIG. 7 as an example, but FIGS. 4 and 6 are both surely able to be taken as an example. In this example, described mainly is the impedance determination circuit additionally provided to the FIG. 7. This impedance determination circuit serves to determine whether or not the impedance found by the impedance calculation circuit is in a predetermined range.

In the impedance adjustment circuit 40 of FIG. 8, the impedance determination circuit 70 is configured to include a first comparator 701, a second comparator 702, and an AND circuit 703. As to the first comparator 701, the negative-side input thereof is connected to the output of the second differential amplifier 604, and the positive-side input thereof is connected with a positive-side reference voltage. As to the second comparator 702, the positive-side input thereof is connected to the output of the second differential amplifier 604, and the negative-side input thereof is connected with a negative-side reference voltage. The AND circuit 703 performs the logical OR with the outputs of the first and second comparators 701 and 702 as inputs.

In this impedance adjustment circuit 40, for easy comparison in the impedance determination circuit 70, the output of the impedance calculation circuit 60 is the result of shifting the voltage value by a reference voltage Vref. That is, in the second differential amplifier 604 of the impedance calculation circuit 60, the resistances 608 and 609 are both connected to each of the input, and between the output and the negative-side input, a resistance 610 is connected. Moreover, to the positive-side input of the second differential amplifier 604, the reference voltage Vref is provided via a resistance 611.

In the impedance adjustment circuit 40 configured as such, for adjusting the impedance, first of all, in the operating point calculation circuit 50, the current I1 of the first current source 503 is so controlled that the input voltage V1 on the side of the first variable resistance 502 is equalized with the input voltage V2 on the side of the reference resistance 506. The input voltages V1 and V2 are those to be directed to the first differential amplifier 507. Through such control over the current I1 of the first current source 503, an intersection point of the V–I curve and the load curve of the reference resistance is found. Next, in the impedance calculation circuit 60, the second and third current sources 604 and 607 are each changed by the current of ΔI/2 at thus found intersection point, thereby outputting, from the second differential amplifier 604, the voltage Vref+ΔV as a result of shifting the voltage ΔV by the referent voltage Vref.

The impedance determination circuit 70 then determines whether or not the voltage Vref+ΔV provided by the second differential amplifier 604 is in a predetermined range of Vref +ΔV1. At this decision making, the first comparator 701 compares between Vref+ΔV and Vref+ΔV1, and the comparison result tells Low when ΔV1>ΔV and High ΔV1<ΔV. The second comparator 702 compares between Vref+ΔV and Vref−ΔV1, and the comparison result tells High when −ΔV1>ΔV and Low −ΔV1 <ΔV. The AND circuit 703 then outputs a determination signal of High when an incoming input shows ΔV1<ΔV and −ΔV1>ΔV.

Operation of Impedance Adjustment Method

Figure 9:
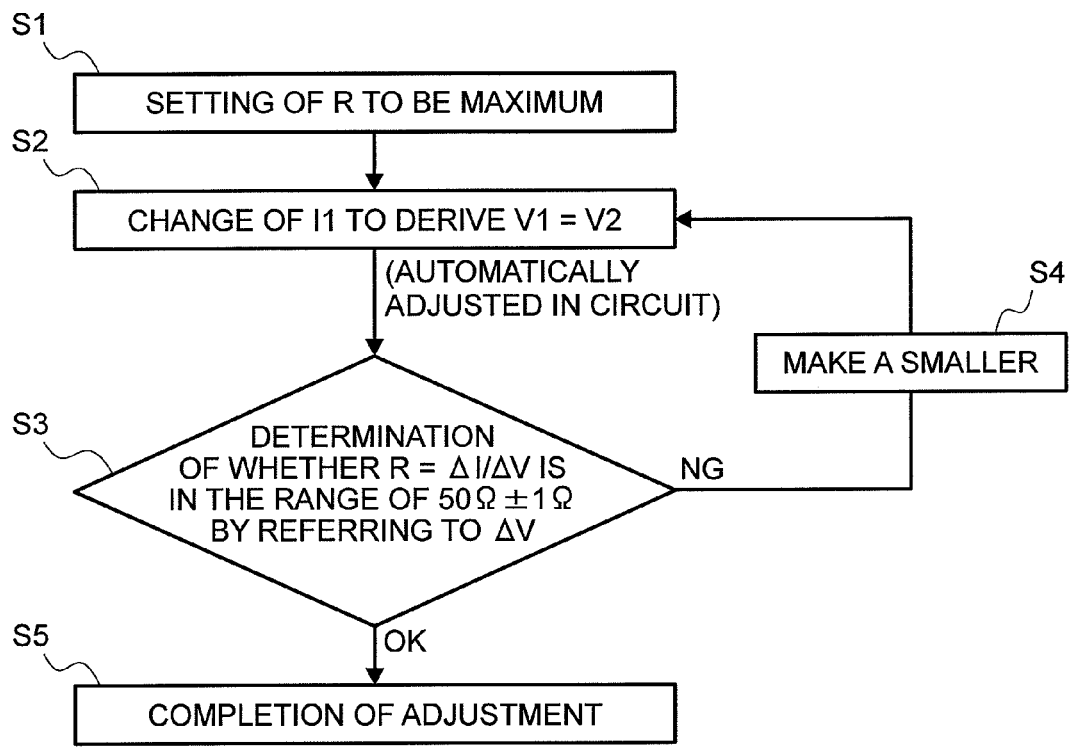
FIG. 9 is a flowchart of the impedance adjustment method for the impedance adjustment circuit in the semiconductor circuit of the embodiment of the invention.

FIG. 9 is a flowchart of an impedance adjustment method of the impedance adjustment circuit of FIG. 4. This impedance adjustment method is applicable also to the impedance adjustment circuits of FIGS. 6, 7, and 8.

First of all, in the operating point calculation circuit 50, the resistance value R of the first variable resistance 502 and that of the second variable resistance 505 are both set maximum (S1). Then in the first differential amplifier 507, the current I1 of the first current source 503 is changed to derive the input voltage V1=V2 (S2). This operation is automatically adjusted in the circuit.

Based on the voltage ΔV provided by the second differential amplifier 604 of the impedance calculation circuit 60, a determination is made whether or not the impedance R=ΔV/ΔI is in the range of 50Ω±1Ω (S3). When the impedance R is not in the range of 50Ω+1Ω (NG), the impedance R is made smaller (S4). The operation (S2) of changing the current I1 to derive V1=V2 is then repeated, and the adjustment is completed when the impedance R falls in the range of 50Ω±1Ω (OK) (S5)

Impedance Adjustment Circuit of Receiver Circuit

Figure 10:
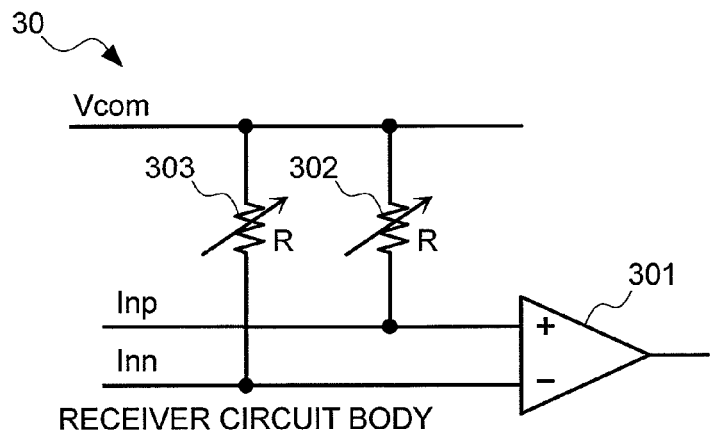
FIG. 10 is a circuit diagram of a receiver circuit in the semiconductor circuit of the embodiment of the invention.
Figure 11:
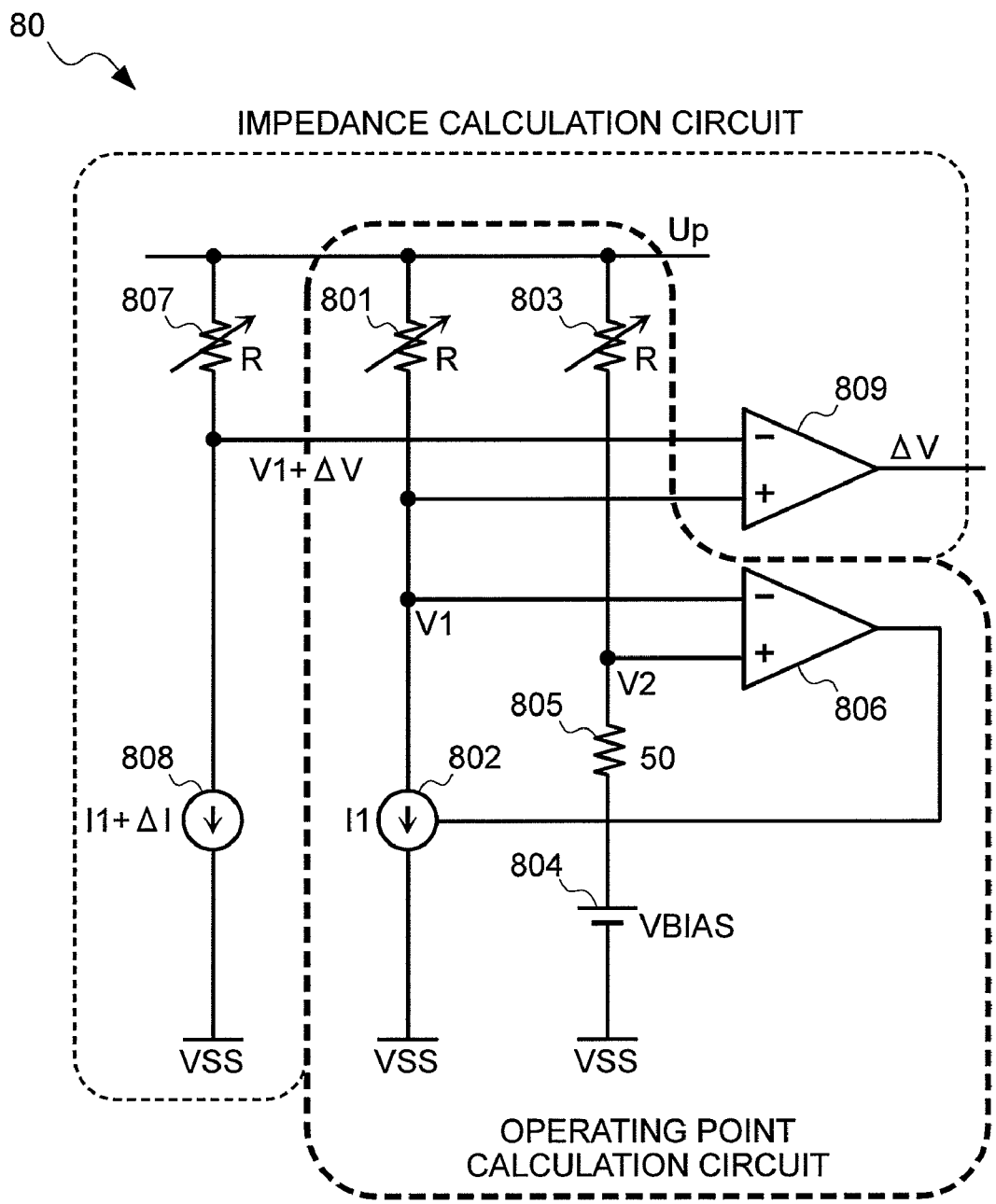
FIG. 11 is a circuit diagram of an impedance adjustment circuit of the receiver circuit in the semiconductor circuit of the embodiment of the invention.

FIG. 10 is a circuit diagram of a receiver circuit. FIG. 11 is a circuit diagram of an impedance adjustment circuit of the receiver circuit.

As shown in FIG. 10, the receiver circuit body 30 of the receiver circuit 2 is configured to include a differential amplifier 301 and variable resistances 302 and 303. The differential amplifier 301 serves to receive input signals, and the variable resistances 302 and 303 are for impedance adjustment use.

As shown in FIG. 11, an impedance adjustment circuit 80 of the receiver circuit 2 is configured to include an operating point calculation circuit and an impedance calculation circuit. The operating point calculation circuit serves to automatically calculate an operating point with a reference resistance through feedback control. The impedance calculation circuit serves to calculate the impedance at the operating point found by this operating point calculation circuit.

The operating point calculation circuit is configured to include a first variable resistance 801, a first current source 802, a second variable resistance 803, a reference resistance 805, and a first differential amplifier 806. As to the first variable resistance 801, a first end thereof is connected to the power supply potential. The first current source 802 is connected between a second end of the first variable resistance 801 and the ground potential. As to the second variable resistance 803, a first end thereof is connected to the power supply potential. The reference resistance 805 is connected between a second end of the second variable resistance 803 and a voltage bias 804 connected to the ground potential. As to the first differential amplifier 806, each input is connected to both the second ends of the first and second variable resistances 801 and 803, and an output thereof is used for control of the first current source 802.

The impedance calculation circuit is configured to include a third variable resistance 807, a second current source 808, and a second differential amplifier 809. As to the third variable resistance 807, a first end thereof is connected to the power supply potential. The second current source 808 is connected between a second end of the third variable resistance 807 and the ground potential. As to the second differential amplifier 809, each input is connected to both the second ends of the third and first variable resistances 807 and 801.

In the impedance adjustment circuit 80 configured as such, for adjusting the impedance, first of all, in the operating point calculation circuit, the current I1 of the first current source 802 is so controlled that the input voltage V1 on the side of the first variable resistance 801 is equalized with the input voltage V2 on the side of the second variable resistance 803. The input voltages V1 and V2 are those to be directed to the first differential amplifier 806. Through such control over the current I1 of the first current source 802, an intersection point of the V–I curve and the load curve of the reference resistance is found in the circuit. Next, in the impedance calculation circuit 60, the second current source 808 is changed by the current of ΔI at thus found intersection point, thereby outputting the resulting voltage ΔV from the second differential amplifier 809. Based on the current ΔI and the voltage ΔV, the impedance R=ΔV/ΔI is then calculated.

Configuration of Semiconductor Circuit

Figure 12:
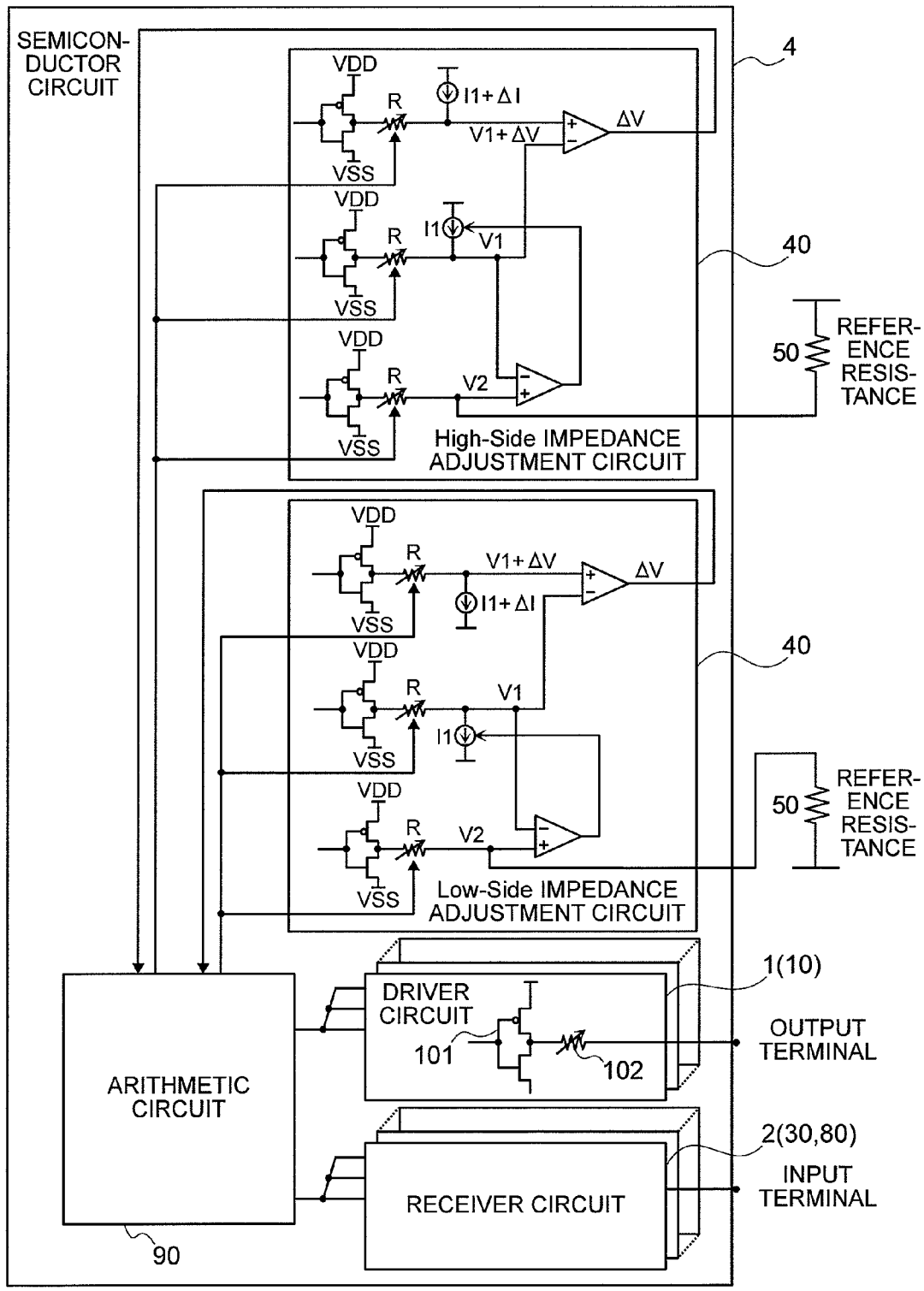
FIG. 12 is a configuration diagram of the semiconductor circuit of the embodiment of the invention.

FIG. 12 is a configuration diagram of a semiconductor circuit.

A semiconductor circuit 4 is configured to include the driver circuit 1, i.e., the driver circuit body 10, the impedance adjustment circuits 40 for High-side and Low-side, the receiver circuit 2, i.e., the receiver circuit body 30 and the impedance adjustment circuit 80, an arithmetic circuit 90, and others. The driver circuit 1 has the nonlinear output resistance characteristics. The impedance adjustment circuits 40 each have a replica circuit having the characteristics same as those of the driver circuit 1, i.e., the nonlinear output resistance characteristics. The receiver circuit 2 has the nonlinear input resistance characteristics, and the arithmetic circuit 90 controls these circuits in terms of impedance adjustment and impedance setting.

As described above by referring to FIG. 1, the driver circuit body 10 of the driver circuit 1 is provided with the CMOS circuit 101 configured by a PMOS and an NMOS transmitting output signals, and the variable resistance 102 provided for impedance adjustment use.

As described above by referring to FIG. 4 and FIGS. 6 to 8, for example, the impedance adjustment circuits 40 of the driver circuit 1 provided for High-side and Low-side, respectively, are each configured by the operating point calculation circuit 50 automatically calculating an operating point with the reference resistance through feedback control, and the impedance calculation circuit 60 calculating the impedance at the operating point found by the operating point calculation circuit 50. The impedance adjustment circuits 40 are each also preferably provided with the impedance determination circuit 70 that determines whether or not the impedance found by the impedance calculation circuit 60 is in a predetermined range.

As described above by referring to FIG. 10, for example, the receiver circuit body 30 of the receiver circuit 2 is configured to include the differential amplifier 301 for receiving input signals, and the variable resistances 302 and 303 for impedance adjustment use.

As described above by referring to FIG. 11, for example, the impedance adjustment circuits 80 of the receiver circuit 2 for High-side and Low-side, respectively, are each configured by an operating point calculation circuit automatically calculating an operating point with the reference resistance through feedback control, and an impedance calculation circuit calculating the impedance at the operating point thus found by the operating point calculation circuit.

In this semiconductor circuit 4, if the driver circuit body 10 is provided with an impedance adjustment circuit, the resulting extra circuit will degrade the transmission characteristics thereof. In consideration thereof, generally, the semiconductor circuit 4 is provided with the impedance adjustment circuits 40 for the High-side and Low-side having the characteristics same as those of the driver circuit body 10, and these impedance adjustment circuits 40 take charge of impedance adjustment. The result of adjustment is reflected to the driver circuit body 10 so that the driver circuit 1 can be optimally adjusted in impedance. Similarly, the receiver circuit 2 is provided with the impedance adjustment circuits 80 for the High-side and Low-side having the characteristics same as those of the receiver circuit body 30, and these impedance adjustment circuits 80 take charge of impedance adjustment. The result of adjustment is reflected to the receiver circuit body 30 so that the receiver circuit 2 can be optimally adjusted in impedance.

Configuration of Computing Device

Figure 13:
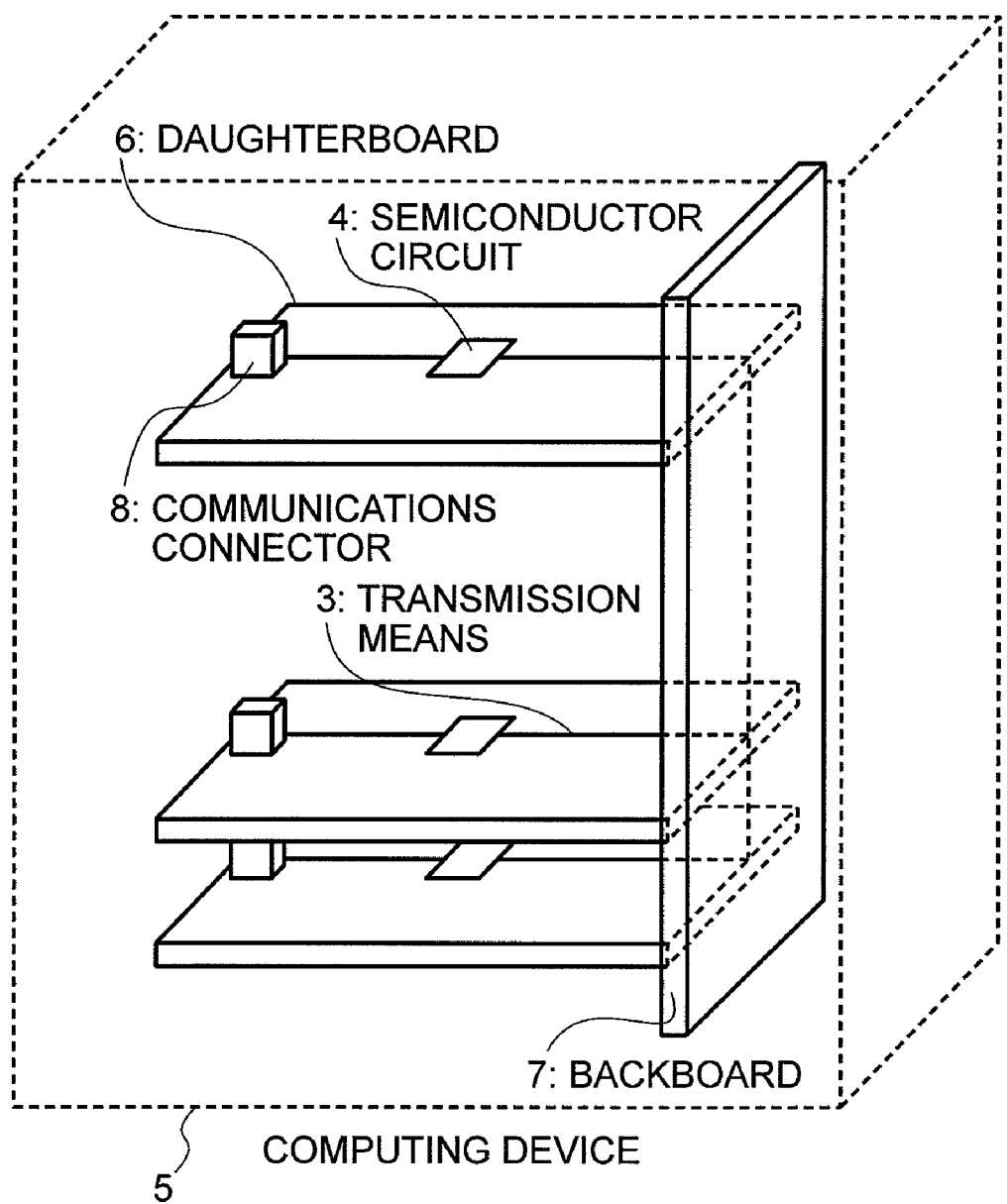
FIG. 13 is a configuration diagram of a computing device using the semiconductor circuit of the embodiment of the invention.

FIG. 13 is a configuration diagram of a computing device.

A computing device 5 is configured by a plurality of daughterboards 6 each mounted with the above-described semiconductor circuit 4, a backboard 7 mounted with these daughterboards 6, and others. The daughterboards 6 are each mounted with a communications connector 8 and others in addition to the semiconductor circuit 4 including a CPU (Central Processing Unit) and others, and these components are electrically connected together via circuit wiring being the transmission media 3.

With such a computing device 5, even if characteristics variations in manufacturing are observed in the semiconductor circuit 4 mounted on each of the daughterboards 6, the impedance can be optimally set after being calculated for each of the semiconductor circuits 4. Moreover, even if the ambient environments, e.g., temperature, power supply, and voltage, of the daughterboards 6 vary, the impedance can be optimally set after being calculated for each of the daughterboards 6.

Configuration of Communications Device

Figure 14:
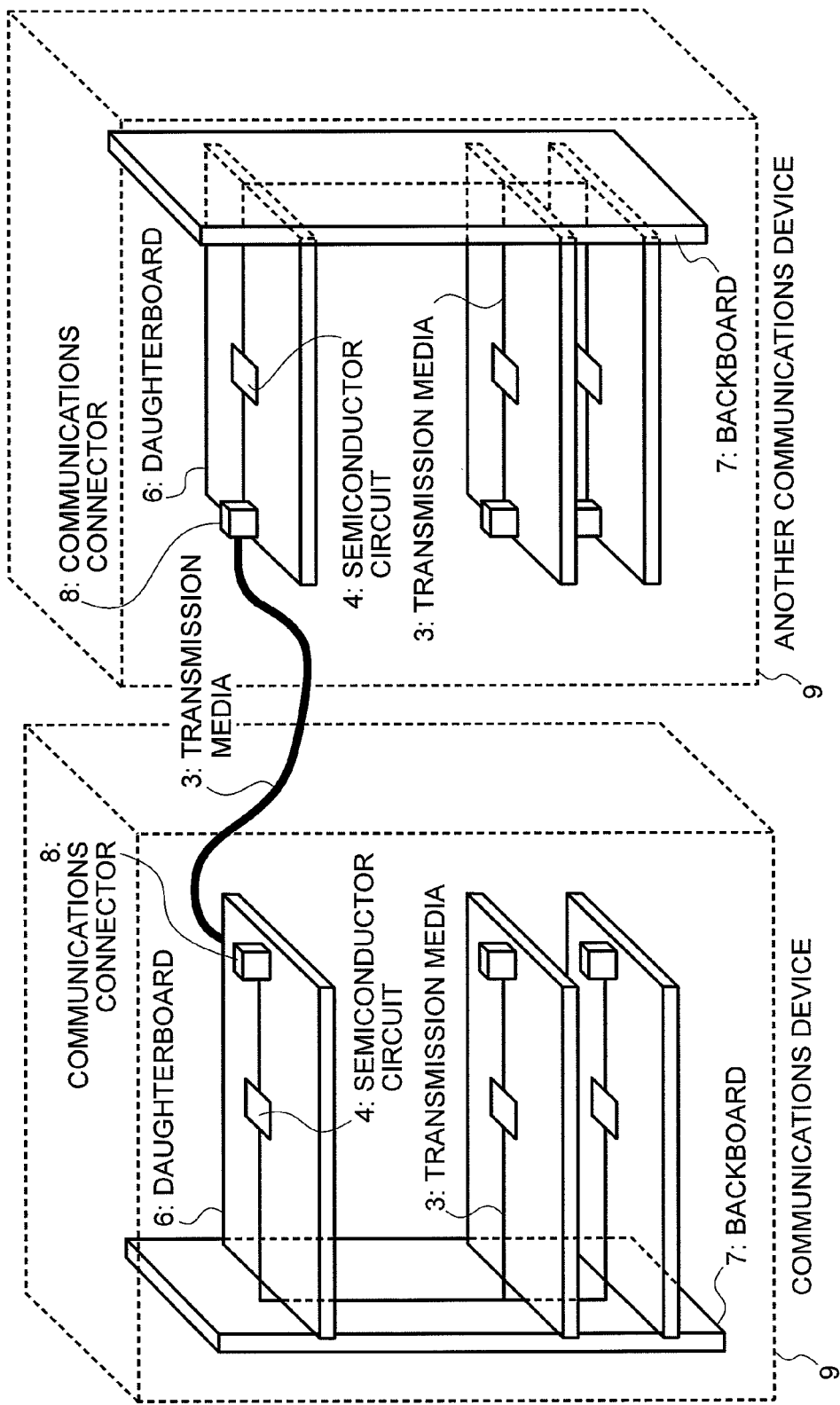
FIG. 14 is a configuration diagram of a communications device using the semiconductor circuit of the embodiment of the invention.

FIG. 14 is a configuration diagram of a communications device.

A communications device 9 is configured by a plurality of daughterboards 6 each mounted with the above-described semiconductor circuit 4, the backboard 7 mounted with the daughterboards 6, and others. The daughterboards 6 are each mounted with the communications connector 8 and others in addition to the semiconductor circuit 4 including a communications interface and others, and these components are electrically connected together via circuit wiring being the transmission media 3.

Such a communications device 9 can transmit/receive signals with other communications devices 9 of the similar configuration over a cable, which is the transmission media 3 connected to the communications connector 8.

With such a communications device 9, even if some characteristics variations in manufacturing are observed therein, and even if the ambient environments, e.g., temperature and power supply voltage, of the communications device 9 vary, the impedance can be optimally set after being calculated for each thereof.

Effects of Embodiment of the Invention

As described in the foregoing, according to the embodiment, impedance adjustment can be automatically made that is essential requirements for product application when an environmental change occurs, e.g., temperature change, in the semiconductor circuit 4 including the driver circuit 1 having the nonlinear output resistance characteristics, the receiver circuit 2 having the nonlinear input resistance characteristics, an input/output circuit having the nonlinear input/output resistance characteristics, and others.

Moreover, also in the computing device 5 and the communications device 9 using such a semiconductor circuit 4, even if some characteristics variations in manufacturing are observed therein, and even if the ambient environments thereof vary, the impedance can be optimally set after being calculated for each thereof.

While the invention proposed by the inventor has been described in detail by way of an embodiment, the foregoing description is in all aspects illustrative and not restrictive. It is understood that numerous other modifications and variations can be devised without departing from the scope of the invention. The impedance adjustment technology for use with the semiconductor circuit of the invention is applicable to an input/output circuit having the nonlinear resistance characteristics, and a computing device, and a communications device, and others using the input/output circuit.

In the invention of this application, the effects to be achieved by the typical aspects are briefly described below. That is, with the effects to be achieved by the typical aspects, automatic adjustment of resistance that is essential requirements for product application when an environmental change occurs, e.g., temperature change can be enabled in a semiconductor circuit including a circuit having the nonlinear resistance characteristics.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor circuit, comprising:
    a first circuit having nonlinear resistance characteristics; and
    a second circuit for impedance adjustment use having nonlinear resistance characteristics which are the same as nonlinear resistance characteristics of the first circuit, wherein
    the second circuit includes:
        an operating point calculation circuit that includes a first CMOS circuit, a second CMOS circuit, a reference resistance and a first differential amplifier, and that is automatically configured to calculate, through feedback control, an operating point with the reference resistance and the second CMOS circuit, wherein the second CMOS circuit and the reference resistance are directly connected to one another during said calculation of said operating point and wherein the first differential amplifier compares an output from the first CMOS circuit and an output from the second CMOS circuit connected to the reference resistance and feedbacks a result of said comparing to the first CMOS circuit; and
        an impedance calculation circuit that calculates an impedance at the operating point calculated by the operating point calculation circuit.

2. The semiconductor circuit according to claim 1, further comprising
    an impedance determination circuit that determines whether or not the impedance found by the impedance calculation circuit is in a predetermined range.

3. The semiconductor circuit according to claim 2, wherein the operating point calculation circuit, the impedance calculation circuit, and the impedance determination circuit are provided two each for High-side impedance adjustment use and Low-side impedance adjustment use.

4. The semiconductor circuit according to claim 3, wherein the operating point calculation circuit includes:
    a first CMOS circuit;
    a first variable resistance whose first end is connected to an output of the first CMOS circuit;
    a first current source connected between a second end of the first variable resistance and a power supply potential;
    a second CMOS circuit;
    a second variable resistance whose first end is connected to an output of the second CMOS circuit;
    a reference resistance connected between a second end of the second variable resistance and a power supply/2 potential; and
    a first differential amplifier that each input is connected to both the second ends of the first and second variable resistances, and whose output is used for control of the first current source,
the impedance calculation circuit includes:
    a third CMOS circuit;
    a third variable resistance whose first end is connected to an output of the third CMOS circuit;
    a second current source connected between a second end of the third variable resistance and a power supply potential; and
    a second differential amplifier that each input is connected to both the second ends of the third and first variable resistances,
an intersection point of a V–I curve and a load curve of the reference resistance is searched through control over a current I1 of the first current source to equalize an input voltage V1 on a side of the first variable resistance into the first differential amplifier and an input voltage V2 on a side of the second variable resistance thereinto, and
an impedance R=$\Delta V/\Delta I$ is calculated by outputting a voltage $\Delta V$ from the second differential amplifier as a result of changing the second current source by a current $\Delta I$ at the intersection point.

5. The semiconductor circuit according to claim 4, wherein the impedance determination circuit includes:
    a first comparator whose negative-side input is connected to an output of the second differential amplifier and whose positive-side input is connected with a positive-side reference voltage;
    a second comparator whose positive-side input is connected to the output of the second differential amplifier, and whose negative-side input is connected with a negative-side reference voltage; and
    an arithmetic circuit that performs a logical operation with outputs of the first and second comparators as inputs, and
a determination is made whether or not the voltage $\Delta V$ provided by the second differential amplifier is in a predetermined range.

6. The semiconductor circuit according to claim 3, wherein the operating point calculation circuit includes:
    a first CMOS circuit;
    a first variable resistance whose first end is connected to an output of the first CMOS circuit;

a first current source connected between a second end of the first variable resistance and a power supply potential;
a reference resistance whose first end is connected to a power supply/2 potential;
a third current source connected between a second end of the reference resistance and a ground potential; and
a first differential amplifier that each input is connected to both the second end of the first variable resistance and the second end of the reference resistance, and whose output is used for control of the first and third current sources, the impedance calculation circuit includes:
a third CMOS circuit;
a third variable resistance whose first end is connected to an output of the third CMOS circuit;
a second current source connected between a second end of the third variable resistance and the power supply potential; and
a second differential amplifier that each input is connected to both the second ends of the third and first variable resistances, an intersection point of a V–I curve and a load curve of the reference resistance is searched through control over a current I1 of the first current source to equalize an input voltage V1 on a side of the first variable resistance into the first differential amplifier and an input voltage V2 on a side of the reference resistance thereinto, and
an impedance R=ΔV/ΔI is calculated by outputting a voltage ΔV from the second differential amplifier as a result of changing the second current source by a current ΔI at the intersection point.

7. The semiconductor circuit according to claim 3, wherein the operating point calculation circuit includes:
a first CMOS circuit;
a first variable resistance whose first end is connected to an output of the first CMOS circuit;
a first current source connected between a second end of the first variable resistance and a power supply potential;
a second CMOS circuit;
a second variable resistance whose first end is connected to an output of the second CMOS circuit;
a reference resistance connected between a second end of the second variable resistance and a power supply/2 supply potential; and
a first differential amplifier that each input is connected to both the second ends of the first and second variable resistances, and whose output is used for control of the first current source, the impedance calculation circuit includes:
a third CMOS circuit;
a third variable resistance whose first end is connected to an output of the third CMOS circuit;
a second current source connected between a second end of the third variable resistance and the power supply potential;
a fourth CMOS circuit;
a fourth variable resistance whose first end is connected to an output of the fourth CMOS circuit;
a third current source connected between a second end of the fourth variable resistance and the power supply potential; and
a second differential amplifier that each input is connected to both the second ends of the third and fourth variable resistances, an intersection point of a V–I curve and a load curve of the reference resistance is searched through control over a current I1 of the first current source to equalize an input voltage V1 on a side of the first variable resistance into the first differential amplifier and an input voltage V2 on a side of the reference resistance thereinto, and
an impedance R=ΔV/ΔI is calculated by outputting a voltage ΔV from the second differential amplifier as a result of changing the second and third current sources each by a current ΔI/2 at the intersection point.

8. The semiconductor circuit according to claim 1, wherein the first circuit has input resistance characteristics, output resistance characteristics, or input/output resistance characteristics, all of which are nonlinear.

9. A computing device using the semiconductor circuit of claim 1.

10. A communications device using the semiconductor circuit of claim 1.

11. A semiconductor circuit, comprising:
a first circuit having nonlinear resistance characteristics; and
a second circuit for impedance adjustment use having nonlinear resistance characteristics which are the same as nonlinear resistance characteristics of the first circuit, wherein
the second circuit includes:
an operating point calculation circuit that includes a first CMOS circuit, a second CMOS circuit, a reference resistance and a first differential amplifier, and that is automatically configured to calculate, through feedback control, an operating point with the reference resistance and the second CMOS circuit, wherein the second CMOS circuit and the reference resistance are directly connected to one another during said calculation of said operating point and wherein the first differential amplifier compares an output from the first CMOS circuit and an output from the second CMOS circuit connected to the reference resistance and feedbacks a result of said comparing to the first CMOS circuit; and
an impedance calculation circuit that calculates an impedance at the operating point calculated by the operating point calculation circuit,
further comprising:
an impedance determination circuit that determines whether or not the impedance found by the impedance calculation circuit is in a predetermined range;
wherein the operating point calculation circuit, the impedance calculation circuit, and the impedance determination circuit are provided two each for High-side impedance adjustment use and Low-side impedance adjustment use; and
wherein the operating point calculation circuit includes:
a first CMOS circuit;
a first variable resistance whose first end is connected to an output of the first CMOS circuit;
a first current source connected between a second end of the first variable resistance and a power supply potential;
a second CMOS circuit;
a second variable resistance whose first end is connected to an output of the second CMOS circuit;
a reference resistance connected between a second end of the second variable resistance and a power supply/2 potential; and a first differential amplifier that each input is connected to both the second ends of the first and second variable resistances, and whose output is used for control of the first current source, the impedance calculation circuit includes:

a third CMOS circuit;

a third variable resistance whose first end is connected to an output of the third CMOS circuit;

a second current source connected between a second end of the third variable resistance and a power supply potential; and a second differential amplifier that each input is connected to both the second ends of the third and first variable resistances, an intersection point of a V–I curve and a load curve of the reference resistance is searched through control over a current I1 of the first current source to equalize an input voltage V1 on a side of the first variable resistance into the first differential amplifier and an input voltage V2 on a side of the second variable resistance thereinto, and an impedance $R=\Delta V/\Delta I$ is calculated by outputting a voltage $\Delta V$ from the second differential amplifier as a result of changing the second current source by a current $\Delta I$ at the intersection point.

12. A semiconductor circuit, comprising:

a first circuit having nonlinear resistance characteristics; and a second circuit for impedance adjustment use having nonlinear resistance characteristics which are the same as nonlinear resistance characteristics of the first circuit, wherein the second circuit includes:

an operating point calculation circuit that includes a first CMOS circuit, a second CMOS circuit, a reference resistance and a first differential amplifier, and that is configured to automatically calculate, through feedback control, an operating point with the reference resistance and the second CMOS circuit, wherein the second CMOS circuit and the reference resistance are directly connected to one another during said calculation of said operating point and wherein the first differential amplifier compares an output from the first CMOS circuit and an output from the second CMOS circuit connected to the reference resistance and feedbacks a result of said comparing to the first CMOS circuit; and an impedance calculation circuit that calculates an impedance at the operating point calculated by the operating point calculation circuit, further comprising:

an impedance determination circuit that determines whether or not the impedance found by the impedance calculation circuit is in a predetermined range;

wherein the operating point calculation circuit, the impedance calculation circuit, and the impedance determination circuit are provided two each for High-side impedance adjustment use and Low-side impedance adjustment use; and wherein the operating point calculation circuit includes:

a first CMOS circuit;

a first variable resistance whose first end is connected to an output of the first CMOS circuit;

a first current source connected between a second end of the first variable resistance and a power supply potential;

a reference resistance whose first end is connected to a power supply/2 potential;

a third current source connected between a second end of the reference resistance and a ground potential; and a first differential amplifier that each input is connected to both the second end of the first variable resistance and the second end of the reference resistance, and whose output is used for control of the first and third current sources, the impedance calculation circuit includes:

a third CMOS circuit;

a third variable resistance whose first end is connected to an output of the third CMOS circuit;

a second current source connected between a second end of the third variable resistance and the power supply potential; and a second differential amplifier that each input is connected to both the second ends of the third and first variable resistances, an intersection point of a V–I curve and a load curve of the reference resistance is searched through control over a current I1 of the first current source to equalize an input voltage V1 on a side of the first variable resistance into the first differential amplifier and an input voltage V2 on a side of the reference resistance thereinto, and an impedance $R=\Delta V/\Delta I$ is calculated by outputting a voltage $\Delta V$ from the second differential amplifier as a result of changing the second current source by a current $\Delta I$ at the intersection point.

13. A semiconductor circuit according to claim 11, wherein the impedance determination circuit includes:

a first comparator whose negative-side input is connected to an output of the second differential amplifier and whose positive-side input is connected with a positive-side reference voltage;

a second comparator whose positive-side input is connected to the output of the second differential amplifier, and whose negative-side input is connected with a negative-side reference voltage; and an arithmetic circuit that performs a logical operation with outputs of the first and second comparators as inputs, and a determination is made whether or not the voltage $\Delta V$ provided by the second differential amplifier is in a predetermined range.

* * * * *